United States Patent
Koli

(10) Patent No.: US 10,771,084 B2
(45) Date of Patent: Sep. 8, 2020

(54) DOUBLE DATA RATE INTERPOLATING ANALOG TO DIGITAL CONVERTER

(71) Applicant: Huawei Technologies Co., Ltd., Shenzhen (CN)

(72) Inventor: Kimmo Koli, Helsinki (FI)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 16/528,005

(22) Filed: Jul. 31, 2019

(65) Prior Publication Data

US 2019/0356327 A1 Nov. 21, 2019

Related U.S. Application Data

(63) Continuation of application No. PCT/EP2017/052025, filed on Jan. 31, 2017.

(51) Int. Cl.
  *H03M 1/20* (2006.01)
  *H04B 1/16* (2006.01)
  *H03K 3/0233* (2006.01)
  *H03F 3/45* (2006.01)

(52) U.S. Cl.
  CPC .......... *H03M 1/206* (2013.01); *H03K 3/0233* (2013.01); *H04B 1/16* (2013.01); *H03F 3/45179* (2013.01)

(58) Field of Classification Search
  CPC .... H03M 1/0863; H03M 1/363; H03M 1/002; H03M 1/44; H03M 1/466; H03M 1/203; H04B 1/16
  USPC .................................................. 341/131–155
  See application file for complete search history.

(56) References Cited

U.S. PATENT DOCUMENTS

| 4,980,577 A | 12/1990 | Baxter |
| 5,625,309 A | 4/1997 | Fucili et al. |
| 5,856,800 A | 1/1999 | Le Pailleur et al. |
| 7,324,038 B2 * | 1/2008 | van der Goes .. H03K 17/04106 341/118 |

(Continued)

FOREIGN PATENT DOCUMENTS

| CN | 103840808 A | 6/2014 |
| CN | 106209101 A | 12/2016 |
| EP | 2940872 A1 | 11/2015 |

OTHER PUBLICATIONS

Miyahara, M., et al, "22.6, A 2.2GS/s 7b 27.4mW Time-Based Folding-Flash ADC with Resistively Averaged Voltage-to-Time Amplifiers," IEEE International Solid-State Circuits Conference Digest of Technical Papers (ISSCC), Mar. 6, 2014, 3 pages.

(Continued)

*Primary Examiner* — Lam T Mai
(74) *Attorney, Agent, or Firm* — Conley Rose, P.C.

(57) ABSTRACT

A double data rate comparator includes a double data rate comparator core, the comparator core configured to compare a voltage of an input signal to a reference signal during each of a rising edge and a falling edge in a single clock cycle of a clock input to the comparator core, and a double data rate set-reset flip flop circuit, the set-reset flip flop circuit comprising a set input and a reset input connected to respective outputs of the double data rate comparator core, the set-reset flip flop circuit configured to perform a set-reset operation during the rising edge in the single clock cycle and the falling edge in the single clock cycle.

20 Claims, 9 Drawing Sheets

(56) References Cited

U.S. PATENT DOCUMENTS

| | | | | |
|---|---|---|---|---|
| 7,557,746 | B1* | 7/2009 | Waltari | H03M 1/206 |
| | | | | 341/158 |
| 7,737,875 | B2* | 6/2010 | Waltari | H03M 1/206 |
| | | | | 341/158 |
| 8,269,527 | B2 | 9/2012 | Ueda | |
| 8,324,951 | B1 | 12/2012 | Zarkesh-Ha et al. | |
| 9,106,248 | B1* | 8/2015 | Fan | H03M 1/12 |
| 9,501,073 | B2* | 11/2016 | Petrov | G05F 1/56 |
| 10,461,763 | B2* | 10/2019 | Koli | H03M 1/363 |
| 2004/0155807 | A1* | 8/2004 | van der Goes | H03K 17/04106 |
| | | | | 341/156 |
| 2009/0009256 | A1 | 1/2009 | Jang et al. | |
| 2009/0073020 | A1 | 3/2009 | Shimizu et al. | |
| 2012/0026026 | A1* | 2/2012 | Kabir | H03M 1/1225 |
| | | | | 341/158 |
| 2012/0062296 | A1 | 3/2012 | Miyashita | |
| 2013/0028313 | A1* | 1/2013 | Shen | H04L 25/03057 |
| | | | | 375/233 |
| 2014/0146429 | A1 | 5/2014 | Lee et al. | |
| 2014/0361917 | A1* | 12/2014 | Matsuno | G01R 19/0038 |
| | | | | 341/155 |
| 2016/0134298 | A1 | 5/2016 | Chang | |
| 2017/0054448 | A1* | 2/2017 | Lye | H03M 1/1245 |

OTHER PUBLICATIONS

Oh, D., et al, "A 6-bit 10-GS/s 63-mW 4x TI Time-Domain Interpolating Flash ADC in 65-nm CMOS," ESSCIRC Conference—41st European Solid-State Circuits Conference (ESSCIRC), Nov. 2, 2015, pp. 323-326.

Schinkel, D., et al, "A Double-Tail Latch-Type Voltage Sense Amplifier with 18ps Setup+Hold Time," IEEE International Solid-State Circuits Conference. Digest of Technical Papers, Jun. 18, 2007, 3 pages.

Narayanan, A., et al, "A Fractional-N Sub-Sampling PLL using a Pipelined Phase-Interpolator With an FoM of—250 dB," IEEE Journal of Solid-State Circuits, vol. 51, No. 7, Jul. 2016, pp. 1630-1640.

Oh, D., et al., "A 6-bit 10-GS/s 63-mW 4x TI Time-Domain Interpolating Flash ADC in 65-nm CMOS," XP032803352, IEEE Proceedings of the ESSCIRC, Sep. 14, 2015, pp. 323-326.

Narayanan, A., et al, A Fractional-N Sub-Sampling PLL using a pipelined phase-interpolator with a FoM of -246dB. ESSCIRC Conference 2015—41st European Solid-State Circuits Conference (ESSCIRC), Nov. 2, 2015, 4 pages.

Narayanan, A., et al, "A Fractional-N Sub-Sampling PLL using a Pipelined Phase-Interpolator With an FoM of -250 1B," IEEE Journal of Solid-State Circuits, vol. 51, No. 7, Jul. 2016, pp. 1630-1640.

Greeshma, A G., et al., "Area Efficient Double Edge Triggered Double Tail Comparator," XP055418201, International Journal of Emerging Technology and Advanced Engineering, vol. 4, No. 4, Apr. 1, 2014, pp. 61-65.

Foreign Communication From a Counterpart Application, PCT Application No. PCT/EP2017/052025, International Search Report dated Jan. 3, 2018, 8 pages.

Foreign Communication From a Counterpart Application, PCT Application No. PCT/EP2017/052025, Written Opinion dated Jan. 3, 2018, 11 pages.

* cited by examiner

DOUBLE DATA RATE INTERPOLATING ANALOG TO DIGITAL CONVERTER

CROSS-REFERENCE TO RELATED APPLICATIONS

This application is a continuation of International Application No. PCT/EP2017/052025, filed on Jan. 31, 2017, which is hereby incorporated by reference in its entirety.

TECHNICAL FIELD

The aspects of the disclosed embodiments relate generally to analog to digital converters, and more particularly to a double data rate interpolating analog to digital converter.

BACKGROUND

Modern mobile communication devices such as those based on fifth generation (5G) wireless networks require energy efficient wide bandwidth analog to digital converters (ADC) to support digital processing of received analog radio signals. A preferred approach for supporting flexible multi-mode operation as well as narrow bandwidth modes such as 2G, 3G, and narrowband LTE, is to use delta-sigma ($\Delta\Sigma$) ADCs because of their ability to be implemented with low power yet high dynamic range.

It is desirable to have wideband, high dynamic range, and continuous time $\Delta\Sigma$ ADCs that also have a low oversampling ratio. The traditional approach for implementing $\Delta\Sigma$ ADCs is to use high order loop filter with low resolution quantization (1 to 4 bits). However, this leads to high power consumption in the loop filter and high sensitivity to excess loop delay, variations in temperature, and variability in the manufacturing processes. Alternatively, if an energy efficient implementation of a higher resolution quantizer (such as six bits or more) is found, a lower order loop filter can be realized resulting in lower area, lower power consumption, and reduced sensitivity to variations in environment and manufacturing process.

Once a 6 bit or higher resolution quantizer has been realized, the number of comparators can be reduced using interpolation and folding techniques. Time-based interpolation and folding techniques may also make an energy efficient and robust implementation possible with a low order loop filter and high resolution quantizer.

Thus there is a need for improved interpolating analog-to-digital converters. Accordingly, it would be desirable to provide a system that addresses at least some of the problems identified above.

SUMMARY

It is an object of the disclosed embodiments to provide a double data rate interpolating analog to digital converter. This object is solved by the subject matter of the independent claims. Further advantageous modifications can be found in the dependent claims.

According to a first aspect of the disclosed embodiments the above and further objects and advantages are obtained by a double data rate comparator device. In one embodiment, the double data rate comparator device includes a double data rate comparator core, the comparator core configured to compare a voltage of an input signal to a reference signal during each of a rising edge and a falling edge in a single clock cycle of a clock input to the comparator core. A double data rate set-reset flip flop circuit includes a set input and a reset input connected to respective outputs of the double data rate comparator core, the set-reset flip flop circuit configured to perform a set-reset operation during the rising edge in the single clock cycle and the falling edge in the single clock cycle. The comparator of the disclosed embodiments operates on both edges of the clock which leads to modification also in the time-based interpolation circuitry and output set-reset flip-flops. This allows for lower area, lower power consumption, and reduced sensitivity to variations in environment and manufacturing process.

In a first possible implementation form of the double data rate comparator device according to the first aspect, the double data rate comparator core includes a p-type metal-oxide-semiconductor (PMOS) differential amplifier stage and an n-type metal-oxide-semiconductor (NMOS) differential amplifier stage connected together in a push-pull configuration. This allows for double data rate operation on both edges of a clock signal.

In a second possible implementation form of the double data rate comparator device according to the first possible implementation form, the double data rate comparator core includes a first node connecting a first drain of the PMOS differential amplifier stage to a first drain of the NMOS differential amplifier stage and a second node connecting a second drain of the PMOS differential amplifier stage to a second drain of the NMOS differential amplifier stage. Prior to the rising edge in the single clock cycle a voltage at the first node and a voltage at the second node is charged towards a positive supply voltage. During the rising edge in the single clock cycle, the voltage at the first node and the voltage at the second node are discharged towards a negative supply voltage. During the falling edge in the single clock cycle the voltage at the first node and the voltage at the second node are charged towards the positive supply voltage. This provides for a linear relationship between the differential input voltage and output delay difference.

In a third possible implementation form of the double data rate comparator device according to the second possible implementation form a plus comparator core output of the comparator core is produced by a complementary metal-oxide-semiconductor (CMOS) inverter coupled to the first node and a minus comparator core output of the comparator core is produced by a second CMOS inverter coupled to the second node. A timing of the plus comparator core output and the minus comparator core output is proportional to a voltage difference between the input signal and the reference signal. This provides the advantage of producing an output logic signal where timing of changes in the state of the output signals is proportional to the differential input voltage.

In a fourth possible implementation form of the double data rate comparator device according to the first aspect as such or according to any one of the preceding possible implementation forms of the first aspect, the double data rate set-reset flip flop circuit includes a first set-reset (SR) latch circuit connected in parallel with a second SR latch circuit, a third SR latch circuit, and a switching device. The switching device is configured to selectively connect the outputs of the first SR latch circuit or the outputs of the second SR latch circuit to respective inputs of the third SR latch circuit. A controller is configured to control the switching device to switch between the outputs of the first SR latch circuit and the outputs of the second SR latch circuit when a state of a signal on the set input and a state of a signal on the reset input to the set-reset circuit are equal. This provides the advantage of selecting a stable output signal for all possible input signals.

In a fifth possible implementation form of the computing double data rate comparator device according to the fourth possible implementation form, a set input and a reset input of the first SR latch circuit are connected to the respective outputs of the double data rate comparator core, and a set input and a reset input of the second SR latch circuit are connected to inverted forms of the respective outputs of the double data rate comparator core. Providing separate latches driven by inverted and non-inverted inputs allows selection of stable output values for all input signal permutations.

In a sixth possible implementation form of the double data rate comparator device according to fourth or fifth possible implementation forms of the first aspect, the set input of the first SR latch circuit is connected to a set input node of the set-reset circuit, the reset input of the first SR latch circuit is connected to a reset input node of the set-reset circuit, the reset input of the second SR latch circuit is connected to an output of an inverter connected between the set input node and the reset input, the set input of the second SR latch circuit is connected to an output of an inverter connected between the reset input node and the set input, and the switching device is configured to selectively connect the first input of the third SR latch circuit and the second input of the third SR latch circuit to the respective first and second outputs of the first SR latch circuit and the respective first and second outputs of the second SR latch circuit. This configuration ensures that the outputs are never connected to the outputs of an unstable SR latch.

In a seventh possible implementation form of the double data rate comparator device according to any of the fourth to sixth possible implementation forms of the first aspect, the controller has a first input connected to the set input node of the set-reset circuit, a second input connected to the reset node of the set-reset circuit and an output connected to a switching control input of the switching device. This configuration allows the control circuit to connect the proper SR latch outputs to the outputs of the double data rate SR latch.

According to a second aspect of the disclosure, the above and further objects and advantages are obtained by a radio receiver that includes the double data rate comparator device according to the first aspect as such or according to any of the preceding possible implementation forms of the first aspect. Use of the double data rate ADC allows a radio receiver to receive and process signals based on multiple different mobile wireless standards.

According to a third aspect of the disclosure the above and further objects and advantages are obtained by a double data rate interpolating analog to digital converter, the double data rate interpolating analog to digital converter including a first comparator core and a second comparator core according to any one of the preceding possible implementation forms of the first aspect as such and a first two stage interpolator block, wherein the first two stage interpolator block has a first stage including a double data rate time-based interpolator block configured to receive a first lower input signal and a first upper input signal, and produce an interpolator output signal, and a second stage, the second stage including a first plurality of CMOS inverters, wherein each CMOS inverter is configured to receive the interpolator output signal and produce a delayed inverter output signal, wherein the first lower input signal is connected to a one of a minus output or a plus output of the first comparator core and the first upper input signal is connected to a corresponding one of a minus output or a plus output of the second comparator core, wherein a slope change of the interpolator output signal is linearly related to a timing between the first lower input signal and the first upper input signal. This provides additional quantization levels based in interpolation between multiple comparator cores.

In a first possible implementation form of the double data rate interpolating analog to digital converter according to the third aspect as such, the interpolator block includes a first PMOS switching leg and a second PMOS switching leg connected in parallel between a positive supply voltage and the interpolator output signal, a first NMOS switching leg and a second NMOS switching leg connected in parallel between a negative supply voltage and the interpolator output signal, and a control circuit configured to receive a clock signal, and produce a first control signal and a second control signal, wherein the first control signal is coupled to the first and second PMOS switching legs and the second control signal is coupled to the first and second NMOS switching legs, wherein the first control signal is configured to disable the first and second PMOS switching legs after a falling edge in the clock signal, and the second control signal is configured to disable the first and second NMOS switching legs after a rising edge in the clock signal. This provides linear interpolation between multiple comparator core outputs based on the voltage to time conversion results of the comparator cores.

In a second possible implementation form of the double data rate interpolating analog to digital converter according to the first possible implementation form of the third aspect as such, the PMOS switching leg and the first NMOS switching leg of the interpolator circuit are connected to the first upper input. The second PMOS switching leg and the second NMOS switching leg of the interpolator circuit are connected to the first lower input. This provides a linear relationship between changes in state of the interpolator inputs and changes in slope of the interpolator outputs.

In a third possible implementation form of the double data rate interpolating analog to digital converter according to the third aspect as such or according to the first or second possible implementation forms of the second aspect, the control circuit of the interpolator block is configured to receive a pair of enable signals, wherein deactivating the pair of enable signals disables both the first and second PMOS switching legs and the first and second NMOS switching legs. This allows power consumption of the interpolators to be reduced.

In a fourth possible implementation form of the double data rate interpolating analog to digital converter according to the third aspect as such or according to any one of the first through third implementation forms of the second aspect, a second two stage interpolator block includes the first stage and the second stage. The second two stage interpolator block is configured to receive a second lower input and a second upper input and generate a second plurality of delayed inverter outputs. The second lower input and the second upper input are both connected to the same the first comparator core (in detail to the same output of the first comparator core), and a first delayed inverter output generated by the first two stage interpolator block is coupled to a second delayed interpolator output generated by the second two stage interpolator block. This provides additional quantization levels to be derived from interpolation between the interpolator block outputs and the reference delays provided by the replica block outputs.

In a fifth possible implementation form of the double data rate interpolating analog to digital converter according to the fourth possible implementation form of the third aspect as such, the double data rate interpolating analog to digital converter includes a plurality of double data rate set-reset flip flop circuits, wherein the second plurality of delayed inverter outputs is generated by a second plurality of CMOS inverters. Each CMOS inverter in both the first plurality of CMOS inverters and the second plurality of CMOS inverters includes one or more unit inverters coupled to the respective first and second set of delayed inverter outputs. A set-reset flip flop circuit in the plurality of set-reset flip flop circuits is connected to one CMOS inverter in the first plurality of CMOS inverter circuits and to one CMOS inverter in the second plurality of CMOS inverter circuits. A same number of unit inverters are connected to each set-reset flip flop circuit. Coupling the interpolator outputs in this fashion allows quantizer outputs to be based on different weighted averages between the comparator cores.

BRIEF DESCRIPTION OF THE DRAWINGS

In the following detailed portion of the present disclosure, the disclosure will be explained in more detail with reference to the example embodiments shown in the drawings, in which.

DETAILED DESCRIPTION OF THE DISCLOSED EMBODIMENTS

Figure 1:
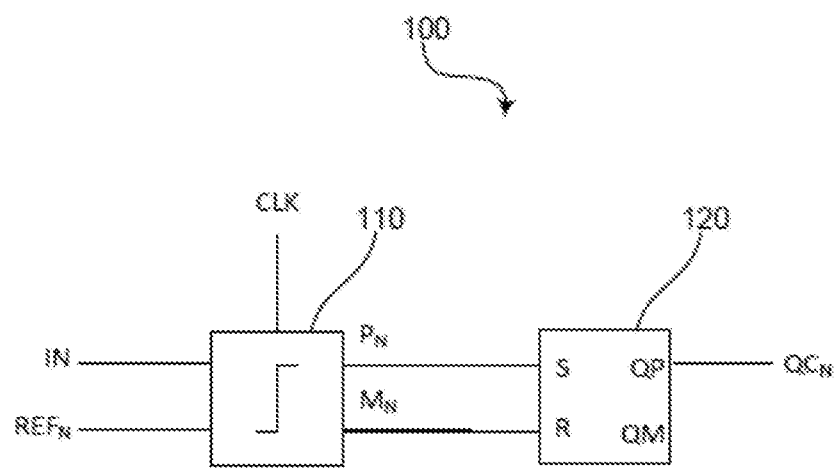
FIG. 1 illustrates a block diagram of an exemplary double data rate comparator device incorporating aspects of the disclosed embodiments.

FIG. 1 illustrates a block diagram of a double data rate comparator device 100 incorporating aspects of the disclosed embodiments. The aspects of the disclosed embodiments are directed to a time-based interpolating analog-to-digital converter. The comparator 100 for the time-base interpolating analog-to-digital converter of the disclosed embodiments reduces current consumption without sacrificing speed, while also allowing for multiple clock frequencies. The comparator reset phase is eliminated so that energy is saved while the maximum achievable sampling rate is increased. Also, the comparator 100 operates on both edges of the clock cycle.

In the example of FIG. 1, the double data rate comparator device 100 includes a double data rate comparator core 110 followed by a double data rate SR flip-flop circuit or latch 120, generally referred to herein as a set-reset flip-flop. In a typical comparator the comparator core is in a reset state when the clock signal (CLK) is low, and the comparator performs the comparison at the rising edge of the clock thereby turning a voltage difference into a delay difference in the comparator core outputs. This delay difference is detected by the SR flip-flop.

In contrast, the aspects of the disclosed embodiments illustrate a double data rate comparator device 100 that is configured to compare a voltage of an input signal (IN) to a reference signal (REFN) during both a rising edge and a falling edge of a single cycle of a clock input (CLK).

The double data rate set-reset flip flop 120 is coupled to the comparator core 110. In one embodiment, the set-reset flip flop 120 has a set input (S) and a reset input (R). The set input (S) is connected to the plus output PN of the comparator core 110 while the reset input (R) is connected to the minus output MN of the comparator core 110. Alternatively, when inversion is desired, the plus output PN may be connected to the reset input (R), and the minus output MN may be connected to the set input (S). The set-reset flip flop 120 is configured to perform a set-reset operation during both the rising edge of the clock (CLK) and the falling edge of the clock (CLK).

Figure 2:
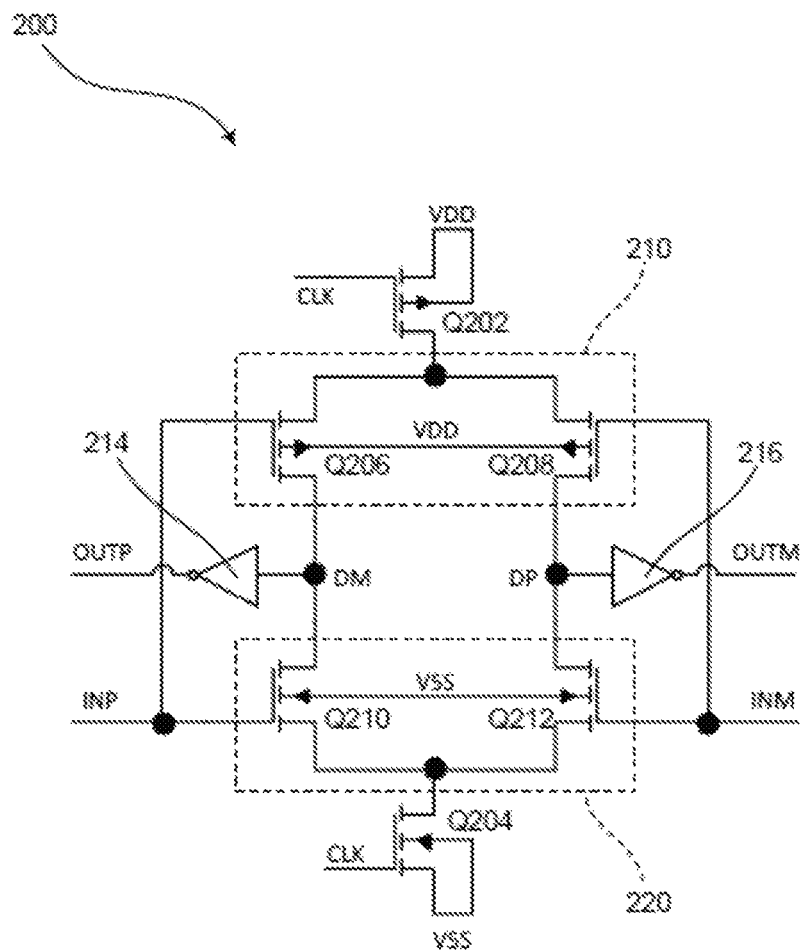
FIG. 2 illustrates a schematic diagram of an exemplary double data rate comparator core for the double data rate comparator device of FIG. 1 incorporating aspects of the disclosed embodiments.

FIG. 2 illustrates a schematic diagram of one embodiment of a double data rate comparator core 200 appropriate for use as the comparator core 110 of the double data rate comparator device 100 shown in FIG. 1. In this example, the double data rate comparator core 200 is constructed of a PMOS differential stage 210 having a pair of PMOS transistors Q206, Q208, and an NMOS differential stage 220 having a pair of NMOS transistors Q210, Q212. The embodiment of FIG. 2 shows the PMOS differential stage 210 and the NMOS differential stage 220 connected together in a push-pull configuration. The push pull configuration allows for operation on both the rising and falling edge of the clock signal.

In one embodiment the double data rate comparator core 200 includes a first node (DM) connecting a first drain of the PMOS differential amplifier stage 210 to a first drain of the NMOS differential amplifier stage 220 and a second node DP connecting a second drain of the PMOS differential amplifier stage 210 to a second drain of the NMOS differential amplifier stage 220.

Prior to the rising edge in the single clock cycle a voltage at the first node DM and a voltage at the second node DP is charged towards a positive supply voltage VDD. During the rising edge in the single clock cycle, the voltage at the first node DM and the voltage at the second node DP are discharged towards a negative supply voltage VSS. During the falling edge in the single clock cycle the voltage at the first node DM and the voltage at the second node DP are charged towards the positive supply voltage VDD.

As noted above, before the rising clock edge, the PMOS differential stage 210 has pulled the nodes DP and DM almost to the positive supply voltage VDD. A small residual voltage difference proportional to input voltage difference will remain. In the case of a large differential input, the comparison is unaffected by this unbalance. In the case of a small differential input, the very small residual voltage imbalance becomes insignificant to the comparison accuracy.

During the rising edge of the clock CLK, nodes DP and DM are discharged towards the negative supply voltage VSS with a rate controlled by input differential voltage. Around the inverter tipping point (approximately half of the supply voltage) both differential stages 210, 220 contribute to the discharging current difference thus maximizing the voltage-to-time conversion. This also means that the input offset voltage of the double data rate comparator core 200 is the average of the two differential pair offsets.

During the falling edge of the clock CLK, nodes DP and DM are charged towards the positive supply voltage VDD with a rate controlled by input differential voltage resulting again into voltage-to-time conversion. The balance between delay differences between rising and falling clock edges are mainly set by the on-resistance of switch transistors Q202, Q204 connected to the differential pair sources.

Figure 3:
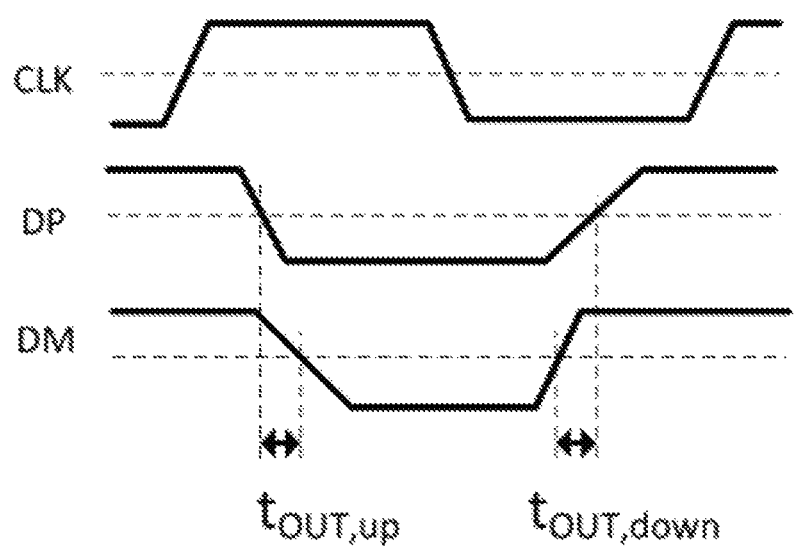
FIG. 3 illustrates a signaling diagram for the double data rate comparator core of FIG. 2 incorporating aspects of the disclosed embodiments.

As illustrated in FIG. 2, in one embodiment a plus comparator core output OUTP of the comparator core 200 is produced by a CMOS inverter 214 coupled to the first node DM. A minus comparator core output OUTM of the comparator core 200 is produced by a second CMOS inverter 216 coupled to the second node DP. FIG. 3 illustrates exemplary signaling waveforms associated with the comparator core 200. As shown in FIG. 3, a timing of the plus comparator core output OUTP and the minus comparator core output OUTM is proportional to a voltage difference between the plus input signal INP and the minus input signal INM. In one embodiment, the plus and minus comparator core inputs INP, INM shown in FIG. 2 may be connected to the inputs for reference signal REFN and signal IN of FIG. 1.

Figure 4:
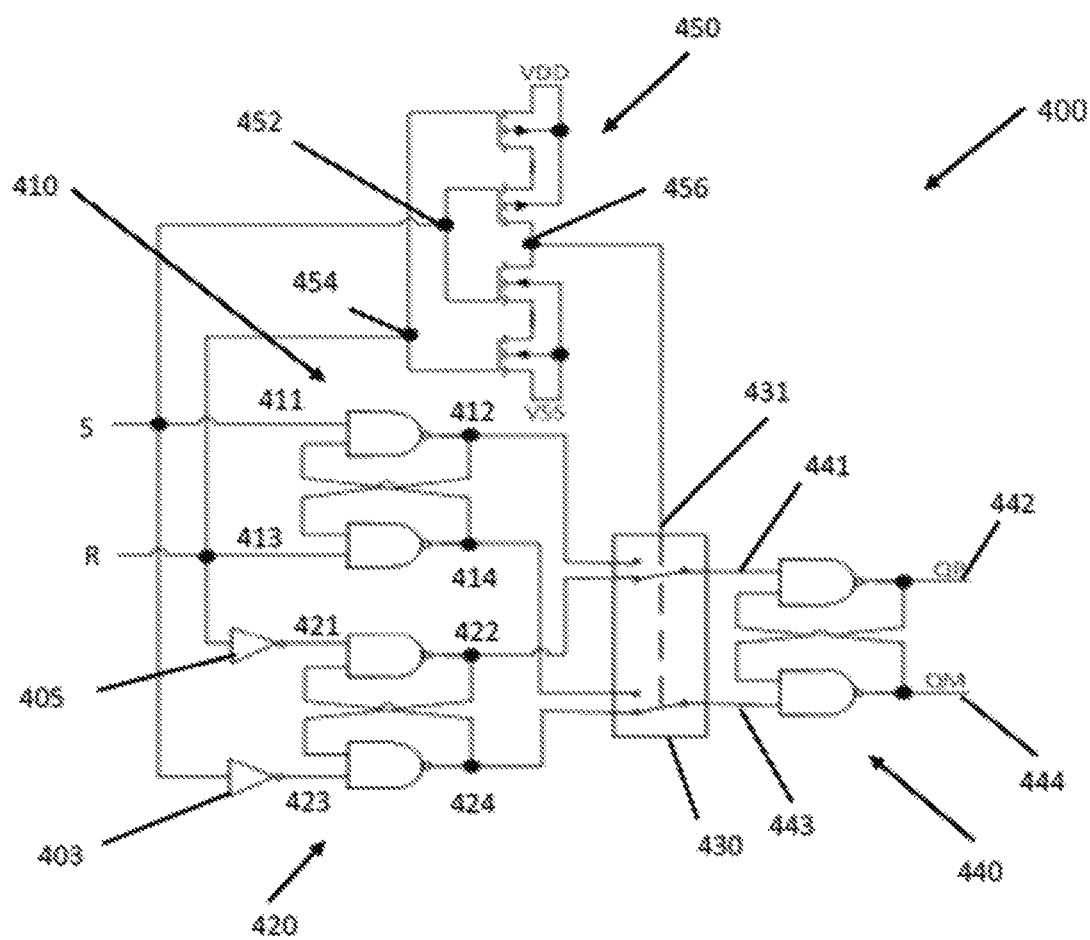
FIG. 4 illustrates a schematic diagram of an exemplary double data rate flip flop circuit for the double data rate comparator of FIG. 1 incorporating aspects of the disclosed embodiments.

FIG. 4 illustrates one embodiment of a clock-less set-reset flip flop 400 appropriate for use as the set-reset flip flop 120 illustrated in FIG. 1. In the schematic illustration of FIG. 4, a first SR latch circuit 410 is connected in parallel with a second SR latch circuit 420. In the example of FIG. 4, the first SR latch circuit 410 and the second SR latch circuit 420 comprises NAND-based SR flip-flops or latches. In alternate embodiments, the two sets of latch circuits 410, 420 can comprise any suitable type of SR latch circuit.

In the example of FIG. 4, the first SR latch circuit 410 includes a set input 411 and a reset input 413. The set input 411 and reset input 413 of the first SR latch circuit 410 can be connected to the respective outputs PN, MN of the double data rate comparator core 400. The first input 411 of the first SR latch circuit 410 is also connected to the set input node S of the set-reset circuit 400 and the second input 413 of the first SR latch circuit 410 is also connected to the reset input node R of the set-reset circuit 400.

The second SR latch circuit 420 includes set input 421 and reset input 423. The set input 421 and the reset input 423 of the second. SR latch circuit 420 are connected to inverted forms of the respective outputs PN, MN of the double data rate comparator core 110*n*. As is shown in FIG. 4, the first input 423 of the second SR latch circuit 420 is connected to an output of an inverter 403 connected between the set input node S and the first input 423. The second input 421 of the second SR latch circuit 420 is connected to an output of an inverter 405 connected between the reset input node R and the second input 421.

The two sets of latch circuits 410, 420 may follow the output of a comparator core circuit such as the comparator core 110 or the comparator core 200 illustrated above. Since a SR flip-flop output is unstable when both the set and reset signals are active, in one embodiment, the set-reset flip flop 400 includes a switching device or multiplexer 430. The switching device 430 is configured to select the correct driving signal for the third, or output SR latch circuit 440. The switching device 430 is configured to selectively connect outputs 412, 414 of the first SR latch circuit 410 or outputs 422, 424 of the second SR latch circuit 420 to respective inputs 441, 443 of the third SR latch circuit 440. For example, in one embodiment, the switching device 430 is configured to selectively connect the first input 441 of the third SR latch circuit 440 and the second input 443 of the third. SR latch circuit 440 to the respective first and second outputs 412, 414 of the first SR latch circuit 410 and the first and second outputs 422, 424 of the second SR latch circuit 420.

In one embodiment, the switching device 430 is controlled by a controller 450. The controller 450 is configured to control the switching device 430 to switch between outputs 412, 414 and outputs 422, 424 when a state of a signal on the set input S and a state of a signal on the reset input R to the set-reset circuit 400 are equal.

In one embodiment, the controller 450 comprises a four-transistor circuit that includes two NMOS transistors and two PMOS transistors, usually referred to as a C-element. The C-element changes its output only when both S and R inputs are equal, thus triggering the output SR flip-flop 440 with minimum delay. Therefore, the double data-rate set-reset flip flop 400 of the disclosed embodiments does not require a clock to choose the correct output.

In the example of FIG. 4, the controller 450 has a first input 452 connected to the set S input node of the set-reset flip flop 400, a second input 454 connected to the reset R node of the set-reset flip flop 400. The output 456 of the controller 450 is connected to a switching control input 431 of the switching device 430.

Figure 5:
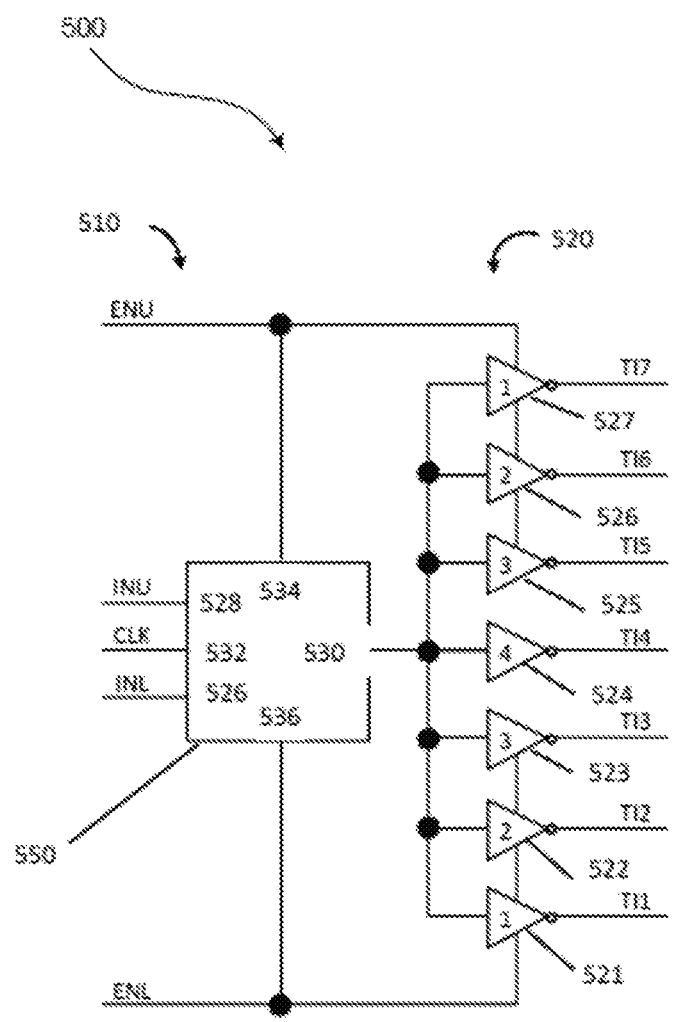
FIG. 5 illustrates a schematic diagram of a two stage interpolator block for a double date rate interpolating analog to digital converter incorporating aspects of the disclosed embodiments.

FIG. 5 illustrates an exemplary two stage interpolation block 500 configured to perform time-based interpolation between adjacent comparator cores in a time-based interpolating ADC. The two stage interpolation block 500, also referred to herein as a two-stage interpolation block 500, uses a double data rate time-based interpolator circuit or block 550 as the first interpolation stage 510 followed by one or more inverter circuits 521 through 527, forming the second stage 520. A clock signal 532 is used to synchronize operation of the double data rate time-based interpolator circuit 550 with other devices such as a double data rate comparator device 100 as described above.

A pair of enable signals ENU 534 and ENL 536 may be used to disable the first stage 510 double data rate interpolator circuit 550 and the second stage 520 inverter circuits 521 through 527 as desired. The enable signals ENU 534 and ENL 536 are advantageous for example to reduce power consumption when the two stage interpolation block 500 is not in use.

Input signals INL, INU to the two stage interpolation block 500 are applied to the double data rate interpolator circuit 550 inputs 526, 528. When both the inputs INL, INU are connected to the same output of one double data rate comparator device 100 the interpolator block 500 produces reference delays as will be discussed further below. An interpolator block configured in this way may be referred to as a replica block as it replicates the input signals. Alternatively, interpolated signals may be generated by connecting each input INL and INU to different double data rate comparator devices 100.

An interpolator output signal 530 produced by the double data rate interpolator circuit 550 in the first stage 510 is used as an input to drive each inverter circuit, 521 through 527, in the second stage 520. Weighted averaging between the inverter output signals TI1 through TI7, which are produced by the inverter circuits 521 through 527 in the second stage 520 of different two stage interpolation blocks 500, is supported by having the inverter circuits 521 through 527 in the second stage 520 configured to generate different drive strengths resulting in varying amounts of delay when inverter output signals TI1 through TI7 originating from different two stage interpolation blocks 500 are connected together. As will be described further below, the drive strength generated by each inverter circuit 521 through 527 is indicated by a number 1, 2, 3, or 4 placed inside each inverter symbol.

Figure 6:
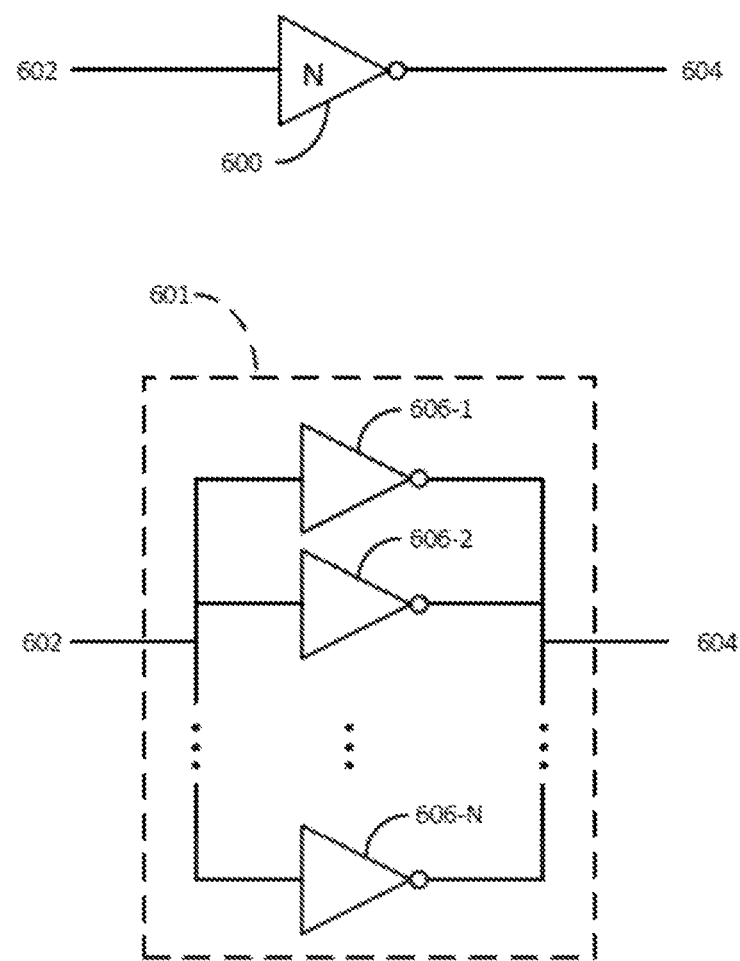
FIG. 6 illustrates a schematic diagram of an exemplary CMOS inverter circuit for a double data rate interpolating analog to digital converter incorporating aspects of the disclosed embodiments.

FIG. 6 illustrates an exemplary embodiment of an inverter circuit 601 incorporating aspects of the disclosed embodiments. The inverter circuit 601 is configured to produce a delay between an input signal 602 and the resulting output signal 604. The inverter circuit 601 uses one or more unit inverters, designated as 606-1, 606-2 . . . 606-N, all connected in parallel to invert and delay the input signal 602 and produce the output signal 604. A single unit inverter 606-1 creates a single unit delay. Coupling number N unit inverters 606-1, 606-2 . . . 606-N in parallel yields a drive strength proportional to the number N of unit inverters coupled in parallel within the inverter circuit 601. For clarity, a simplified inverter symbol 600 is used to indicate the inverter circuit 601, where the inverter symbol 600 includes a number N indicating the number of unit inverters 606-1, 606-2 . . . 606-N coupled in parallel within the inverter circuit 600. The inverter circuits 521 through 527 shown in FIG. 5 above are depicted using the inverter circuit notation 600.

Figure 7:
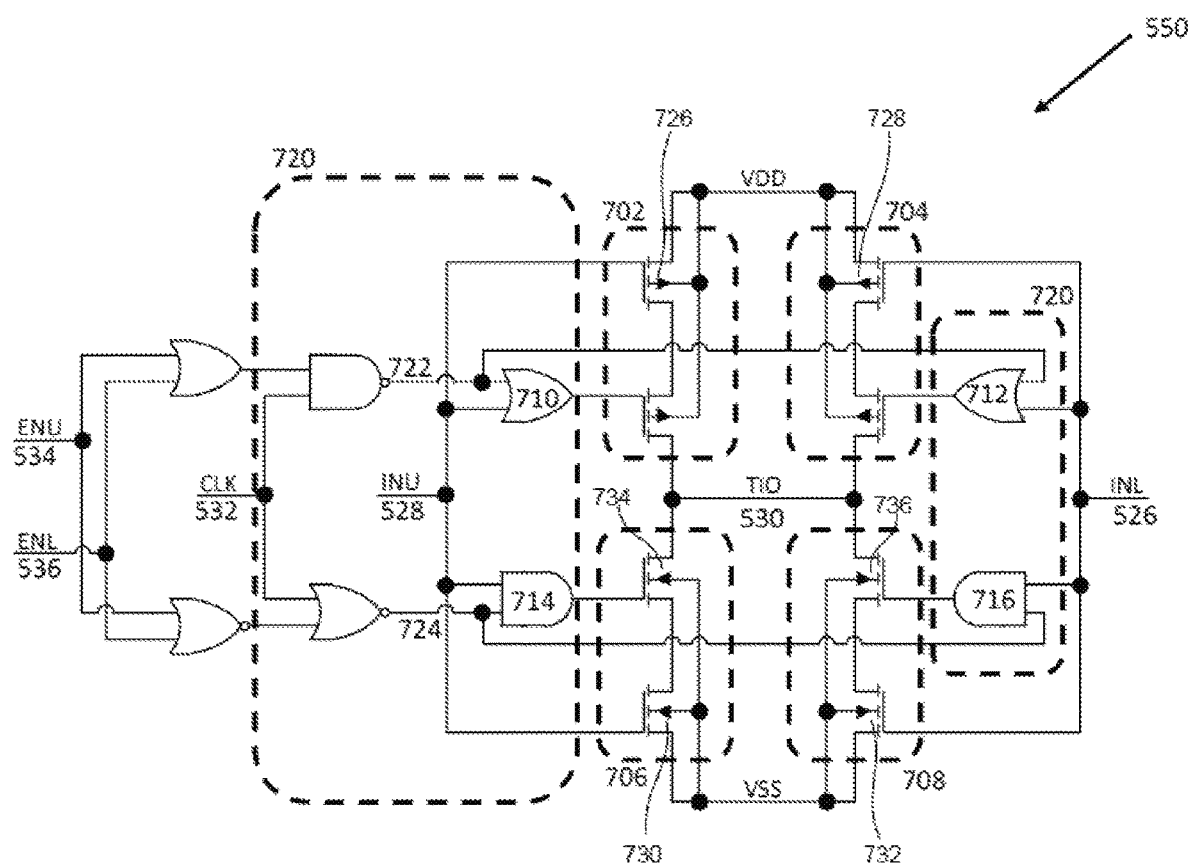
FIG. 7 illustrates a schematic diagram of an exemplary double data rate time-based interpolator incorporating aspects of the disclosed embodiments.

Referring also to FIG. 7, in one embodiment, the time-based interpolating ADC of the disclosed embodiments is constructed with the two-stage configuration of FIG. 1. Both the comparator core and the set-reset flip-flops are implemented with the double data rate versions described herein. The time-based interpolators can be all implemented with simple CMOS-inverters if simplicity is preferred over accuracy. The double data rate operation will help to cancel out part of the nonlinearity.

In the example of FIG. 7, the first stage time-based interpolation is performed with the accurate double data rate time-based interpolator circuit 550 of the disclosed embodiments. In the example of FIG. 7, the interpolator circuit 550 comprises a first PMOS switching leg 702 and a second PMOS switching leg 704. The first PMOS switching leg 702 and the second PMOS switching leg 704 are connected in parallel between a positive supply voltage VDD and the interpolator output signal TIO 530.

A first NMOS switching leg 706 and a second NMOS switching leg 708 are connected in parallel between a negative supply voltage VSS and the interpolator output signal TIO 530. A control circuit 720 is configured to receive a clock signal 532, and produce a first control signal 722 and a second control signal 724. The first control signal 722 is coupled through logic gates 710 and 712 to the first and second PMOS switching legs 702, 704 respectively. The second control signal 724 is coupled through logic gates 714 and 716 to the first and second NMOS switching legs 706, 708 respectively.

In one embodiment, the first control signal 722 is configured to disable the first and second PMOS switching legs 702, 704 after a falling edge in the clock signal CLK 532. The second control signal 724 is configured to disable the first and second NMOS switching legs 706, 708 after a rising edge in the clock signal 532.

The first PMOS switching leg 702 and the first NMOS switching leg 706 of the interpolator block 550 are connected to the first upper input INU 528. The second PMOS switching leg 704 and the second NMOS switching leg 708 of the interpolator block 550 are connected to the first lower input INL 526.

The control circuit 720 of the interpolator block 550 is configured to receive a pair of enable signals ENU 534 and ENL 536. To improve clarity of the schematic diagram of FIG. 7, the control circuit 720 is split into two portions, one portion on the left and another portion on the right side of the diagram, with both portions labeled with the numeral 720. Deactivating the pair of enable signals ENU 534 and ENL 536 disables both the first and second PMOS switching legs 702, 704 and the first and second NMOS switching legs 706, 708. The enable signals ENU 534, ENL 536 are advantageous for example to reduce power consumption when the interpolator block 550 is not in use.

The inputs INU 528 and INL 526 are the main time-based interpolation inputs which as will be described further below may, in certain embodiments, be driven by comparator core outputs, such as the comparator core outputs OUTM or OUTP produced by the exemplary double data rate comparator core 200 described above and with reference to FIG. 2. Either the rising edge or falling edge interpolation configuration is selected by the CLK 532 signal. When the double data rate time-based interpolator block 550 is driven by a comparator core 200, the CLK 532 is advantageously shared with the comparator core 200. The timing of CLK 532 is not critical for operation of an interpolating ADC since there is a significant delay from either a rising or falling edge in the clock signal CLK 532 to the first change in the output signals OUTL, OUTP of the comparator core 200. This loose timing relationship allows adding weak, low power clock buffers before the interpolator block 550.

Figure 8:
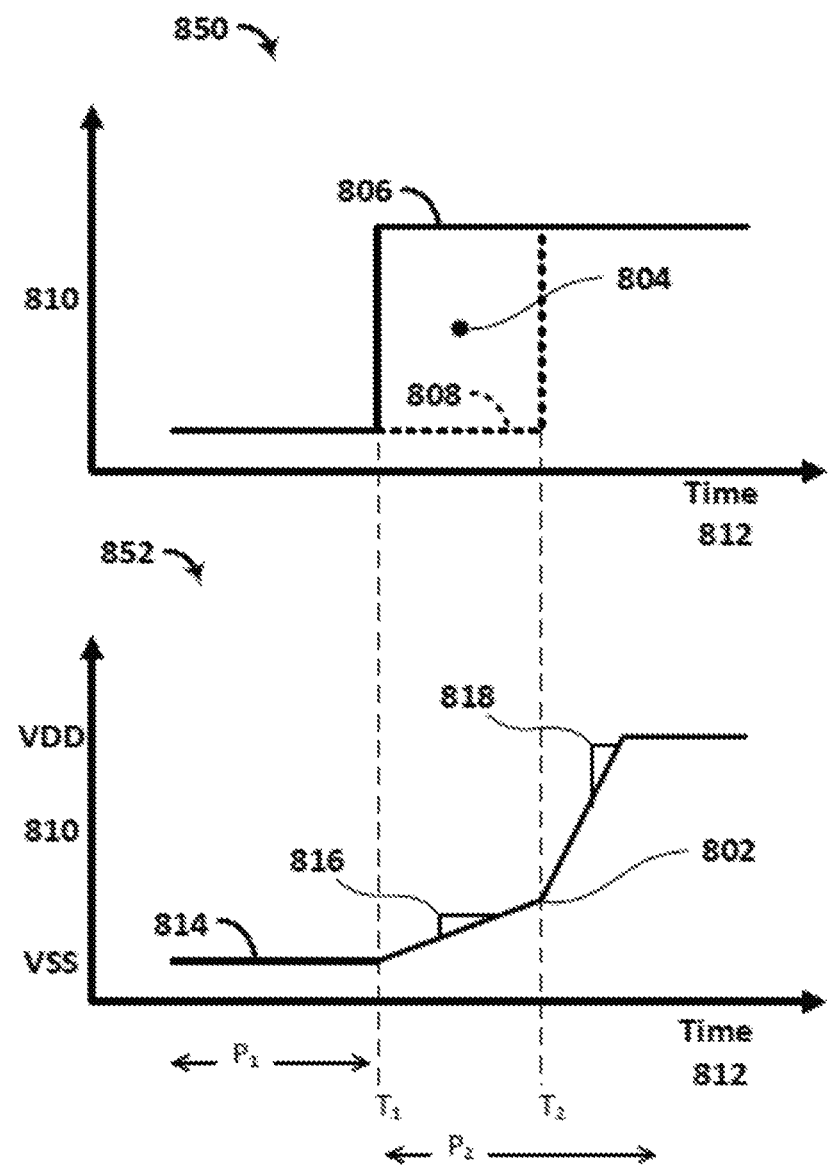
FIG. 8 illustrates exemplary timing waveforms for the double data rate time-based interpolator incorporating aspects of the disclosed embodiments.

FIG. 8 illustrates exemplary signal waveforms associated with operation of the interpolator block 550 incorporating aspects of the disclosed embodiments. Interpolator block 550 inputs INL 806 and INU 808 are illustrated in a first graph 850 where signal magnitude or voltage is shown on a vertical axis 810 increasing upward, and time is illustrated on a horizontal axis 812 increasing to the right. The interpolator output TIO 814 is illustrated in a second graph 852 where the same axes are used to illustrate magnitude or voltage along a vertical axis 810 increasing upward, and time illustrate along a horizontal axis 812 increasing to the right.

In operation, during a first time period P1 when the clock signal CLK 532 is low, the interpolator output TIO 814 is discharged to the negative supply voltage VSS. After the clock signal CLK 532 rises a rising edge interpolation period P2 begins at time T1 when the earliest rising edge of either of the input signals INL 806 or INU 808 occurs. During the rising edge interpolation period P2 the uppermost NMOS-switches 734, 736 are turned off by the clock signal CLK 532 thereby disabling the current sink part of the interpolator 550. When one interpolation input signal, for example INL 806 as illustrated in FIG. 8, rises at time T1, the interpolator output TIO 814 begins charging causing the magnitude of the interpolator output TIO 814 to rise at a first rate 816. Subsequently, when the second interpolation signal INU 808 begins to rise, the charging rate of the interpolator output TIO 814 increases to a second rate 818. In embodiments where both charging branches, such as 702 and 704, are equal sized, the charging rate doubles from the first charging rate 816 to the second charging rate 818 when the second interpolation signal, INU 808 in the above example, begins to rise.

As illustrated in the above example, the slope change 802 in the output signal TIO is determined by or is proportional to the time difference 804 between a first state change in one of the input signals INU or INL and a state change in the other input signal INL or INU. This time difference between state changes 804 is referred to herein as a timing of the input signals. The earlier the slope change 802 occurs in the interpolation period P2 the earlier the output signal TIO will reach a tripping point of a logic circuit, such as a CMOS inverter circuit 600, which may be connected to the output TIO.

At the end of the rising edge interpolation period P2, the output TIO 814 reaches a positive supply voltage VDD. The falling edge of the clock CLK 532 starts a falling edge interpolation period. The falling edge interpolation period is similar to but inverted from the rising edge interpolation period illustrated in FIG. 8 and described above. During the falling edge interpolation period the PMOS legs 702, 704 of the interpolator block 500 are disabled allowing the input signals, INU 528 and INL 526, to control discharging of the interpolator output signal TIO 530.

The main interpolator switch transistors 726, 728, 730, 732 should be implemented with minimum channel length so that the capacitive loading is minimized and the tinting accuracy is maximized. In certain embodiments it is advantageous, for the purpose of accurately controlling the charging and discharging currents, to add separate long channel current starving PMOS transistors (not shown) biased to VBP between the positive supply voltage VDD and the PMOS switches 726, 728, as well as similar current starving NMOS transistors (not shown) biased from VBN added between the ground or negative supply voltage VSS and the NMOS switches 730, 732. These bias voltages can be tuned with an internal bias voltage generator. Alternatively full supply voltage may be used to bias the current starving transistors.

Figure 9:
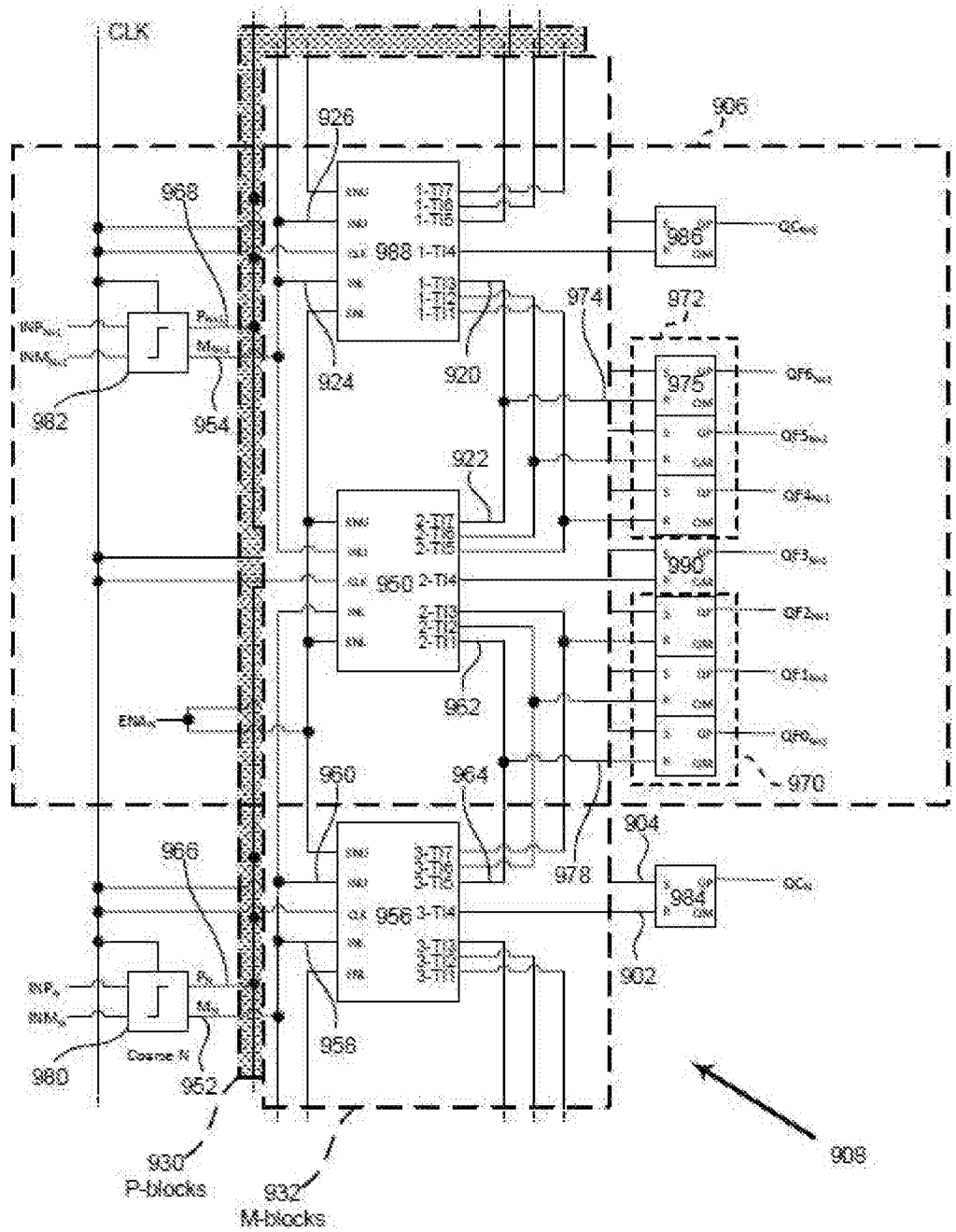
FIG. 9 illustrates a schematic diagram of an exemplary double data rate time based interpolating analog-to-digital converter incorporating aspects of the disclosed embodiments.

FIG. 9 illustrates the principal of constructing a double data rate time-based interpolating ADC 900 incorporating aspects of the disclosed embodiments. As illustrated in FIG. 9 a double data rate time-based interpolating ADC 900, also referred to herein as an interpolating ADC, may be constructed from a plurality of ADC sections 906. FIG. 9 illustrates a complete ADC section 906 with an adjacent partial ADC section shown below generally indicated by numeral 908. The interpolating ADC 900 is constructed using the double data rate building blocks described above. The comparator cores 982, 980 each comprise a double data rate comparator core 200 as illustrated in FIG. 2 and described above. Interpolator blocks 988, 950, 956 each comprise the double data rate time-based interpolator block 500 illustrated in FIG. 5 and described above. Each of the set-reset flip flops 986, 972, 990, 970, 984 comprises the clock-less set-reset flip flop 400 illustrated in FIG. 4 and described above.

Constructing a double data rate time-based interpolating ADC out of the above described building blocks is based on configuring the interpolator blocks 988, 950, 956 to create three-bit, two stage interpolator cells 972, 970 where the interpolator blocks 988, 950, 956, each comprise an accurate double data rate interpolator circuit 550 driving seven weighted CMOS inverters, 521 through 527. The interpolator block 950 interpolates the delays of two adjacent comparator cores 982, 980. While other interpolator blocks 988, 956 provide reference delays based on a single comparator core 982, 980 respectively. Interpolation is achieved by connecting pairs of outputs from neighboring interpolator blocks together.

For example output pairs 1-TI3 & 2-TI7, 1-TI2 & 2-TI6, 1-TI1 & 2-TI5 of interpolator blocks 988 and 950 are used to form a three-bit, two stage interpolation 972. Each pair of connected interpolator block outputs, for example 920 and 922, or 962 and 964, yield the same total number of unit inverters 606 connected to the reset inputs (R) 974, 978.

Referring also to the interpolator block 500 of FIG. 5, output 1-TI3, 920 comprises 3 unit inverters and output 2-TI7 922 comprises one unit inverter for a total of four unit inverters connected to the reset input 974. Therefore all set-reset flip flop inputs (S) (R) will be connected to four unit inverters.

Separate interpolator blocks are used for the plus outputs PN, PN+1 and the minus outputs MN, MN+1 of the comparator cores 982, 980. The minus outputs are coupled to the M-Blocks 932 which are used to drive the reset inputs (R) of the set-reset flip flops 986, 972, 970, 984, 990. The plus outputs PN, PN+1 are coupled to the P-Blocks 930 which are used to drive the set inputs (S) of the set-reset flip flops 986, 972, 970, 984, 990. The P-Blocks 930 are the same as the M-Blocks 932, but for clarity are shown as hidden behind the M-Blocks 932 in FIG. 9.

Coarse outputs QCN+1 from the interpolating ADC 900 may be produced by connecting a double data rate set-reset flip flop 986 to the center output 1-TI4 of the replica interpolator block 988 as illustrated in FIG. 9. Alternatively, the course outputs QCN+1 may be obtained by coupling a double data rate set-reset flip flop 120 directly to outputs of the comparator core 110, as is illustrated in the double data rate comparator device 100 shown in FIG. 1 and described above.

When multiple interpolating ADC sections 906, 908 are coupled together as illustrated in FIG. 9, it is desirable in certain embodiments to select the fine outputs, such as fine outputs QF0N+1 to QF6N+1, from a desired ADC section 906. This may be done using an exclusive or, XOR, function between the course outputs QCN+1, QCN from two closest or adjacent comparator cores 982, 980. The course outputs QCN+1, QCN of an interpolating ADC form a thermometer code. Thus in certain embodiments only the fine outputs of the interpolator block between the comparator cores 982, 980 with different output states are desired.

When the interpolating ADC 900 is used to convert slowly changing signals, such as is often the case in a continuous-time ΔΣ modulator with high oversampling ratio, it is possible to use the enable signals ENAN to reduce power consumption by disabling a portion of the interpolator blocks 988, 950, 956. The border interpolator sections 908 provide layout symmetry which yields manufacturing advantages, while also allowing unused portions (not shown) to be disabled, for example using the enable signals ENU, ENL on the interpolator block 956.

Referring to FIG. 9, the double data rate interpolating analog to digital converter 900 includes a first comparator core 980 and a second comparator core 982. The comparator cores 980 and 982 are similar to the comparator cores 110 or 200 described herein.

In one embodiment, the double data rate interpolating analog to digital converter 900 also includes a first two stage interpolator block 950. The first two stage interpolator block 950 comprises for example the interpolator block 500 illustrated in FIG. 5 and described herein.

Referring also to FIG. 5, the first stage 510 of the first interpolator block 950 comprises a double data rate time-based interpolator circuit 550. The double data rate time-based interpolator circuit 550 is configured to receive a first lower input signal 526 and a first upper input signal 528. The interpolator circuit 550 produces an interpolator output signal 530. The first stage 510 interpolator circuit 550 may for example be implemented as illustrated by the schematic diagram shown in FIG. 7 and described above.

The second stage 520 of the first two stage interpolator block 950 comprises a first plurality of CMOS inverters 521-527. Each CMOS inverter 521-527 is configured to receive the interpolator output signal 530 and produce a delayed inverter output signal 2-T1 through 2-T7.

The first lower input signal 958, received by the double data rate time-based interpolator circuit 550 is connected to a one of a minus output 952 or a plus output 966 of the first comparator core 980 shown in FIG. 9. The first upper input signal 960 is connected to a corresponding one of a minus output 954 or a plus output 968 of the second comparator core 982. As illustrated in FIG. 8 a slope change 802 of the interpolator output signal 530 is linearly related to a timing 804 of the first lower input signal 626 and the first upper input signal 628. Where the timing 804 of the first lower input signal refers to the time difference between the first state transition of one of the input signals 806, 808 and the second state transition of the input signals 808, 806.

In exemplary embodiment illustrated in FIG. 9, the double data rate interpolating analog to digital converter 900 includes a second two stage interpolator block 988. The second two stage interpolator block 988 comprises a two stage interpolator block 500 as illustrated in FIG. 5 and described above and includes the first stage 510 and the second stage 520. In this example, the second two stage interpolator block 988 is configured to receive a second lower input 924 and a second upper input 926 and generate a second plurality of delayed inverter outputs 1-T1 through 1-T7.

As shown in FIG. 9, the second lower input 924 and the second upper input 926 of the second interpolator block 988 are both connected to the same one of the first comparator core 982. Coupling both inputs of the second interpolator block 988 together produces reference delays at the outputs 1-T1 through 1-T7. An interpolator block 500 with both inputs 526 and 528 connected together may be referred to as a replica block as the outputs T1 through T7 replicate a single comparator core. In contrast consider the case as in the first interpolator block 950 where each input 526 and 528 is coupled to different comparator cores resulting in interpolated output signals 2-T1 through 2-T7.

In one embodiment, the double data rate interpolating analog to digital converter 900 includes a plurality of double data rate set-reset flip flop circuits 972. Each input (S) (R) of the set-reset flip flops 972, such as the reset input (R) 974 of set reset flip flop 975 is coupled to a pair of outputs 920, 922 where the pair of outputs 922 comprises one output from each interpolator block 950, 988. As described above with reference to the interpolator block 500, each output 1-T1 through 1-T7 of the first interpolator block 988 is driven by a respective one of a first plurality of CMOS inverters, and each output 2-T1 through 2-T7 of the second two stage interpolator block 950 is driven by a respective one of a second plurality of CMOS inverters. Each CMOS inverter in the first and second plurality of CMOS inverters comprises one or more unit inverters 600-1, 600-N as illustrated in exemplary CMOS inverter circuit 600 described above. Outputs 1-T1, 1-T2, 1-T3 from the first interpolator block 950 are connected in pairs with the outputs 2-T5, 2-T6, 2-T7 of the second interpolator block 988 where each pair of connected outputs 1-T1 & 2-T5, 1-T2 & 2-T6, and 1-T3 & 2-T7 comprise the same number of unit inverters.

For example as illustrated, the interpolator block 500 output 1-T3 920 comprises three unit inverters and output 2-T7 922 comprises one unit inverter yielding a total of 4 unit inverters coupled to the set-reset flip flop input 974. Similarly all connected pairs of outputs 1-T1 & 2-T5, 1-T2 & 2-T6, and 1-T3 & 2-T7 comprise four unit inverters. Alternatively a number of unit inverters less than or greater than four may be advantageously employed where all pairs of connected outputs include the same number of unit inverters.

The aspects of the disclosed embodiments are configured to providing a double data rate interpolating analog to digital converter. The comparator current consumption should be as low as possible without sacrificing speed. Therefore the comparator reset phase is eliminated so that energy is saved while maximum achievable sampling rate is increased. The new comparator of the disclosed embodiments operates on both edges of the clock which leads to modification also in the time-based interpolation circuitry and output set-reset flip-flops.

The aspects of the disclosed embodiments provide a more time based time based interpolation to address the issue of the process dependent nonlinearity of the time-based interpolation performed with CMOS inverters. The linear time-based interpolation of the disclosed embodiments accurately interpolates the time difference of two rising and two falling edges.

The set-reset flip-flops are also modified to compare the time difference of two rising and two falling edges. The rising or falling edge operation is selected locally without the quantizer clock thus reducing clocking power consumption.

The remaining nonlinearity of the dual-data-rate (DDR) ADC produces an error that has opposite polarity for odd and even samples. That error signal can be regarded as a dither signal at Nyquist-frequency that improves performance especially when the time-based interpolating (or folding and interpolating) ADC is used as the quantizer of a first-order delta-sigma modulator typically prone to generate idle tones.

Thus, while there have been shown, described and pointed out, fundamental novel features of the disclosure as applied to the exemplary embodiments thereof, it will be understood that various omissions, substitutions and changes in the form and details of apparatus and methods illustrated, and in their operation, may be made by those skilled in the art without departing from the spirit and scope of the presently disclosed disclosure. Further, it is expressly intended that all combinations of those elements, which perform substantially the same function in substantially the same way to achieve the same results, are within the scope of the disclosure. Moreover, it should be recognized that structures and/or elements shown and/or described in connection with any disclosed form or embodiment of the disclosure may be incorporated in any other disclosed or described or suggested form or embodiment as a general matter of design choice. It is the intention, therefore, to be limited only as indicated by the scope of the claims appended hereto.

What is claimed is:

1. A double data rate comparator device, comprising:
   a double data rate comparator core configured to compare a voltage of an input signal (IN) to a reference signal ($REF_N$) during each of a rising edge and a falling edge in a single clock cycle of a clock input (CLK) to the double data rate comparator core, wherein the double data rate comparator core comprises a p-type metal-oxide-semiconductor (PMOS) differential amplifier stage and an n-type metal-oxide-semiconductor (NMOS) differential amplifier stage connected together in a push-pull configuration; and a double data rate set-reset flip flop circuit configured to perform a set-reset operation during the rising edge in the single clock cycle and the falling edge in the single clock cycle, wherein the double data rate set-reset flip flop circuit comprises:
   a set input (S); and
   a reset input (R) connected to respective outputs ($P_N$, $M_N$) of the double data rate comparator core.

2. The double data rate comparator device of claim 1, wherein the double data rate comparator core further comprises:
   a first node (DM) connecting a first drain of the PMOS differential amplifier stage to a first drain of the NMOS differential amplifier stage; and
   a second node (DP) connecting a second drain of the PMOS differential amplifier stage to a second drain of the NMOS differential amplifier stage, wherein a voltage at the first node (DM) and a voltage at the second node (DP) is charged towards a positive supply voltage (VDD) prior to the rising edge in the single clock cycle, wherein the voltage at the first node (DM) and the voltage at the second node (DP) is discharged towards a negative supply voltage (VSS) during the rising edge in the single clock cycle, and wherein the voltage at the first node (DM) and the voltage at the second node (DP) is charged towards the positive supply voltage (VDD) during the falling edge in the single clock cycle.

3. The double data rate comparator device of claim 2, wherein a plus comparator core output (OUTP) of the double data rate comparator core is produced by a complementary metal-oxide-semiconductor (CMOS) inverter coupled to the first node (DM) and a minus comparator core output (OUTM) of the double data rate comparator core is produced by a second CMOS inverter coupled to the second node (DP), and wherein a timing of the plus comparator core output (OUTP) and the minus comparator core output (OUTM) is proportional to a voltage difference between the input signal (IN) and the reference signal ($REF_N$).

4. The double data rate comparator device of claim 1, wherein the double data rate set-reset flip flop circuit comprises:
   a first set-reset (SR) latch circuit connected in parallel with a second SR latch circuit;
   a third SR latch circuit;
   a switching device configured to selectively connect outputs of the first SR latch circuit; and
   a controller configured to control the switching device to switch between the outputs of the first SR latch circuit and the outputs of the second SR latch circuit in response to a state of a signal on the set input (S) and a state of a signal on the reset input (R) to the double data rate set-reset flip flop circuit being equal.

5. The double data rate comparator device of claim 4, wherein a set input and a reset input of the first SR latch circuit are connected to the respective outputs ($P_N$, $M_N$) of the double data rate comparator core, and wherein a set input and a reset input of the second SR latch circuit are connected to inverted forms of the respective outputs ($P_N$, $M_N$) of the double data rate comparator core.

6. The double data rate comparator device of claim 4, wherein the set input of the first SR latch circuit is connected to a set input node (S) of the set-reset circuit, wherein the reset input of the first SR latch circuit is connected to a reset input node (R) of the set-reset circuit, wherein the reset input of the second SR latch circuit is connected to an output of an inverter connected between the set input node (S) and the reset input, wherein the set input of the second SR latch circuit is connected to an output of an inverter connected between the reset input node (R) and the set input, and wherein the switching device is configured to selectively connect a first input of the third SR latch circuit and a second input of the third SR latch circuit to first and second outputs of the first SR latch circuit and the first and second outputs of the second SR latch circuit.

7. The double data rate comparator device of claim 4, wherein the controller comprises a first input connected to a set (S) input node of the set-reset circuit, a second input connected to a reset (R) node of the set-reset circuit, and an output connected to a switching control input of the switching device.

8. The double data rate comparator device of claim 1, wherein the double data rate set-reset flip flop circuit comprises:
   a first set-reset (SR) latch circuit connected in parallel with a second SR latch circuit;
   a third SR latch circuit;
   a switching device configured to selectively connect outputs of the second SR latch circuit to respective inputs of the third SR latch circuit; and
   a controller configured to control the switching device to switch between the outputs of the first SR latch circuit and the outputs second SR latch circuit in response to a state of a signal on the set input (S) and a state of a signal on the reset input (R) to the set-reset circuit being equal.

9. The double data rate comparator device of claim 1, wherein the double data rate comparator core further comprises:
   a first node (DM) connecting a first drain of the PMOS differential amplifier stage to a first drain of the NMOS differential amplifier stage; and
   a second node (DP) connecting a second drain of the PMOS differential amplifier stage to a second drain of the NMOS differential amplifier stage.

10. A radio receiver comprising:
   a double data rate comparator device, comprising:
      a double data rate comparator core configured to compare a voltage of an input signal (IN) to a reference signal ($REF_N$) during each of a rising edge and a falling edge in a single clock cycle of a clock input (CLK) to the double data rate comparator core, wherein the double data rate comparator core comprises a p-type metal-oxide-semiconductor (PMOS) differential amplifier stage and a n-type metal-oxide-semiconductor (NMOS) differential amplifier stage connected together in a push-pull configuration; and
      a double data rate set-reset flip flop circuit configured to perform a set-reset operation during the rising edge in the single clock cycle and the falling edge in the single clock cycle, wherein the double data rate set-reset flip flop circuit comprises:
         a set input (S); and
         a reset input (R) connected to respective outputs ($P_N$, $M_N$) of the double data rate comparator core.

11. The radio receiver of claim 10, wherein the double data rate comparator core further comprises:

a first node (DM) connecting a first drain of the PMOS differential amplifier stage to a first drain of the NMOS differential amplifier stage; and a second node (DP) connecting a second drain of the PMOS differential amplifier stage to a second drain of the NMOS differential amplifier stage, wherein a voltage at the first node (DM) and a voltage at the second node (DP) is charged towards a positive supply voltage (VDD) prior to the rising edge in the single clock cycle, wherein the voltage at the first node (DM) and the voltage at the second node (DP) is discharged towards a negative supply voltage (VSS) during the rising edge in the single clock cycle, and wherein the voltage at the first node (DM) and the voltage at the second node (DP) is charged towards the positive supply voltage (VDD) during the falling edge in the single clock cycle.

12. The radio receiver of claim 11, wherein a plus comparator core output (OUTP) of the double data rate comparator core is produced by a complementary metal-oxide-semiconductor (CMOS) inverter coupled to the first node (DM) and a minus comparator core output (OUTM) of the double data rate comparator core is produced by a second CMOS inverter coupled to the second node (DP), and wherein a timing of the plus comparator core output (OUTP) and the minus comparator core output (OUTM) is proportional to a voltage difference between the input signal (IN) and the reference signal ($REF_N$).

13. The radio receiver of claim 10, wherein the double data rate comparator core further comprises:
a first node (DM) connecting a first drain of the PMOS differential amplifier stage to a first drain of the NMOS differential amplifier stage; and
a second node (DP) connecting a second drain of the PMOS differential amplifier stage to a second drain of the NMOS differential amplifier stage.

14. A double data rate interpolating analog-to-digital converter comprising:
a first double data rate comparator device;
a second double data rate comparator device; and
a first two-stage interpolator block, comprising:
a first stage comprising a double data rate time-based interpolator block configured to:
receive a first lower input signal and a first upper input signal, wherein the first lower input signal is connected to one of a minus output or a plus output of the first double data rate comparator device, and the first upper input signal is connected to a corresponding one of a minus output or a plus output of the second double data rate comparator device; and
produce an interpolator output signal, wherein a slope change of the interpolator output signal is linearly related to a timing between the first lower input signal and the first upper input signal; and
a second stage comprising a first plurality of complementary metal-oxide-semiconductor (CMOS) inverters, wherein each CMOS inverter is configured to:
receive the interpolator output signal; and
produce a delayed inverter output signal.

15. The double data rate interpolating analog-to-digital converter of claim 14, wherein the double data rate time-based interpolator block comprises:
a first p-type metal-oxide-semiconductor (PMOS) switching leg and a second PMOS switching leg connected in parallel between a positive supply voltage (VDD) and the interpolator output signal;

a first n-type metal-oxide-semiconductor (NMOS) switching leg and a second NMOS switching leg connected in parallel between a negative supply voltage (VSS) and the interpolator output signal; and
a controller configured to:
receive a clock signal; and
produce a first control signal and a second control signal, wherein the first control signal is coupled to the first and second PMOS switching legs and the second control signal is coupled to the first and second NMOS switching legs, wherein the first control signal is configured to disable the first and second PMOS switching legs after a falling edge in the clock signal, and wherein the second control signal is configured to disable the first and second NMOS switching legs after a rising edge in the clock signal.

16. The double data rate interpolating analog-to-digital converter of claim 15, wherein the first PMOS switching leg and the first NMOS switching leg of the double data rate time-based interpolator block are connected to the first upper input signal, and the second PMOS switching leg and the second NMOS switching leg of the double data rate time-based interpolator block are connected to the first lower input signal.

17. The double data rate interpolating analog-to-digital converter of claim 15, wherein the controller of the double data rate time-based interpolator block is configured to receive a pair of enable signals, and wherein deactivating the pair of enable signals disables both the first and second PMOS switching legs and the first and second NMOS switching legs.

18. The double data rate interpolating analog-to-digital converter of claim 14, further comprising a second two-stage interpolator block comprising the first stage and the second stage, wherein the second two-stage interpolator block is configured to:
receive a second lower input and a second upper input, wherein the second lower input and the second upper input are both connected to a common output of the first double data rate comparator device; and
generate a second plurality of delayed inverter outputs, wherein a first delayed inverter output generated by the first two-stage interpolator block is coupled to a second delayed interpolator output generated by the second two-stage interpolator block.

19. The double data rate interpolating analog-to-digital converter of claim 18, further comprising a plurality of double data rate set-reset flip flop circuits, wherein the second plurality of delayed inverter outputs is generated by a second plurality of CMOS inverters, wherein each CMOS inverter in both the first plurality of CMOS inverters and the second plurality of CMOS inverters comprises one or more unit inverters, wherein a set-reset flip flop circuit in a plurality of set-reset flip flop circuits is connected to one CMOS inverter in the first plurality of CMOS inverters and to one CMOS inverter in the second plurality of CMOS inverters, and wherein a same number of unit inverters are connected to each set-reset flip flop circuit.

20. The double data rate interpolating analog-to-digital converter of claim 14, wherein each of the first double data rate comparator device and the second double data rate comparator device comprises:
a double data rate comparator core configured to compare a voltage of an input signal (IN) to a reference signal ($REF_N$) during each of a rising edge and a falling edge in a single clock cycle of a clock input (CLK) to the double data rate comparator core; and a double data rate set-reset flip flop circuit configured to perform a set-reset operation during the rising edge in the single clock cycle and the falling edge in the single clock cycle, wherein the double data rate set-reset flip flop circuit comprises:

a set input (S); and a reset input (R) connected to respective outputs ($P_N$, $M_N$) of the double data rate comparator core.

* * * * *